United States Patent
Plourde et al.

(10) Patent No.: US 11,626,847 B2
(45) Date of Patent: Apr. 11, 2023

(54) AMPLIFIER INPUT OFFSET COMPENSATION

(71) Applicant: Analog Devices, Inc., Wilmington, MA (US)

(72) Inventors: David James Plourde, Pembroke, NH (US); Greg L. Disanto, Groton, MA (US)

(73) Assignee: Analog Devices, Inc., Wilmington, MA (US)

( * ) Notice: Subject to any disclaimer, the term of this patent is extended or adjusted under 35 U.S.C. 154(b) by 162 days.

(21) Appl. No.: 17/175,039

(22) Filed: Feb. 12, 2021

(65) Prior Publication Data

US 2022/0209732 A1     Jun. 30, 2022

Related U.S. Application Data

(60) Provisional application No. 63/132,257, filed on Dec. 30, 2020.

(51) Int. Cl.
  *H03F 3/45* (2006.01)
(52) U.S. Cl.
  CPC ... *H03F 3/45475* (2013.01); *H03F 2200/375* (2013.01)
(58) Field of Classification Search
  CPC .................................... H03F 3/45; H03F 1/30
  USPC .................................................... 330/260, 69
  See application file for complete search history.

(56) References Cited

U.S. PATENT DOCUMENTS

| 8,390,374 B2 | 3/2013 | Alexander et al. |
| 9,385,673 B2 | 7/2016 | Ahmad et al. |
| 2007/0115047 A1 | 5/2007 | Paolo |

FOREIGN PATENT DOCUMENTS

| CN | 212343738 U | * | 1/2021 |
| CN | 114696753 A | | 7/2022 |
| EP | 2075910 A1 | | 7/2009 |

OTHER PUBLICATIONS

"PGA308 User's Guide", Texas Instruments, (2012), 104 pgs.
Zhou, Ying, et al., "Offset Correction Methods: Laser Trim, e-Trim (TM), and Chopper", Texas Instruments, TI TechNotes, (2017), 3 pgs.
"United Kingdom Application Serial No. 2118489.0, Combined Search and Examination Report dated Jun. 17, 2022", 7 pgs.

* cited by examiner

*Primary Examiner* — Henry Choe
(74) *Attorney, Agent, or Firm* — Schwegman Lundberg & Woessner, P.A.

(57) ABSTRACT

Various examples are directed to amplifier circuits and methods for operating amplifier circuits. The amplifier circuit may comprise a first amplifier stage. The first amplifier stage comprises a first amplifier, a first feedback resistance, a second amplifier, a second feedback resistance, and a gain resistance. A first current source may be electrically coupled to provide a first current across the gain resistance in a first direction. A second current source may be electrically coupled to provide a second current across the gain resistance in a second direction opposite to the first direction.

20 Claims, 9 Drawing Sheets

AMPLIFIER INPUT OFFSET COMPENSATION

CLAIM OF PRIORITY

This application claims priority to U.S. Provisional Patent Application Ser. No. 63/132,257, filed Dec. 30, 2020, which is herein incorporated by reference in its entirety.

TECHNICAL FIELD

This document pertains generally, but not by way of limitation, to amplifier circuits and particularly, but not by way of limitation to amplifier circuits with input offset compensation.

BACKGROUND

Amplifier circuits are commonly used to amplify signals including a direct current (DC) or time-varying voltage offset component. An amplifier circuit receiving an input with an offset amplifies the full input signal including the input offset and the signal-of-interest. This can have certain negative consequences, including limiting the gain of the amplifier circuit. For example, because the input offset is also amplified by the amplifier circuit, the total output of the amplifier circuit may exceed a power supply rail at a lower gain than might be possible if the signal-of-interest alone were measured. The dynamic range of the circuit may also suffer, for example, requiring a higher resolution analog-to-digital converter (ADC).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Various examples described herein are directed to circuits and methods for input offset compensation for amplifier arrangements. An example amplifier circuit stage comprises a first amplifier and a second amplifier. The first amplifier is in a negative feedback arrangement with a first feedback resistance electrically coupled between a first amplifier output and a first amplifier inverting input. The second amplifier is also in a negative feedback arrangement with a second feedback resistance electrically coupled between a second amplifier output and a second amplifier inverting input. An input signal is received at the first amplifier non-inverting input and the second amplifier non-inverting input. The amplifier circuit also includes a gain resistance electrically coupled between the first feedback resistance and the second feedback resistance.

A first current source and a second current source are electrically coupled to provide first and second currents across the gain resistance, where the first and second currents are in opposite directions and may be of about equal magnitude. The magnitude of the first and second currents, as described herein, may be selected to modify a gain of an input signal offset, such as an offset voltage. In some examples, the magnitude of the first and second current is selected to bring about a sensor offset gain of one or unity. In this way, the amplifier circuit may amplify the input signal offset voltage by a factor of one while amplifying the signal of interest by the closed-loop gain of the amplifier circuit. In another example, the magnitude of the first and second currents is selected to null the input signal output. In this way, the contribution of the input signal offset to the amplifier circuit may be about zero.

Figure 1:
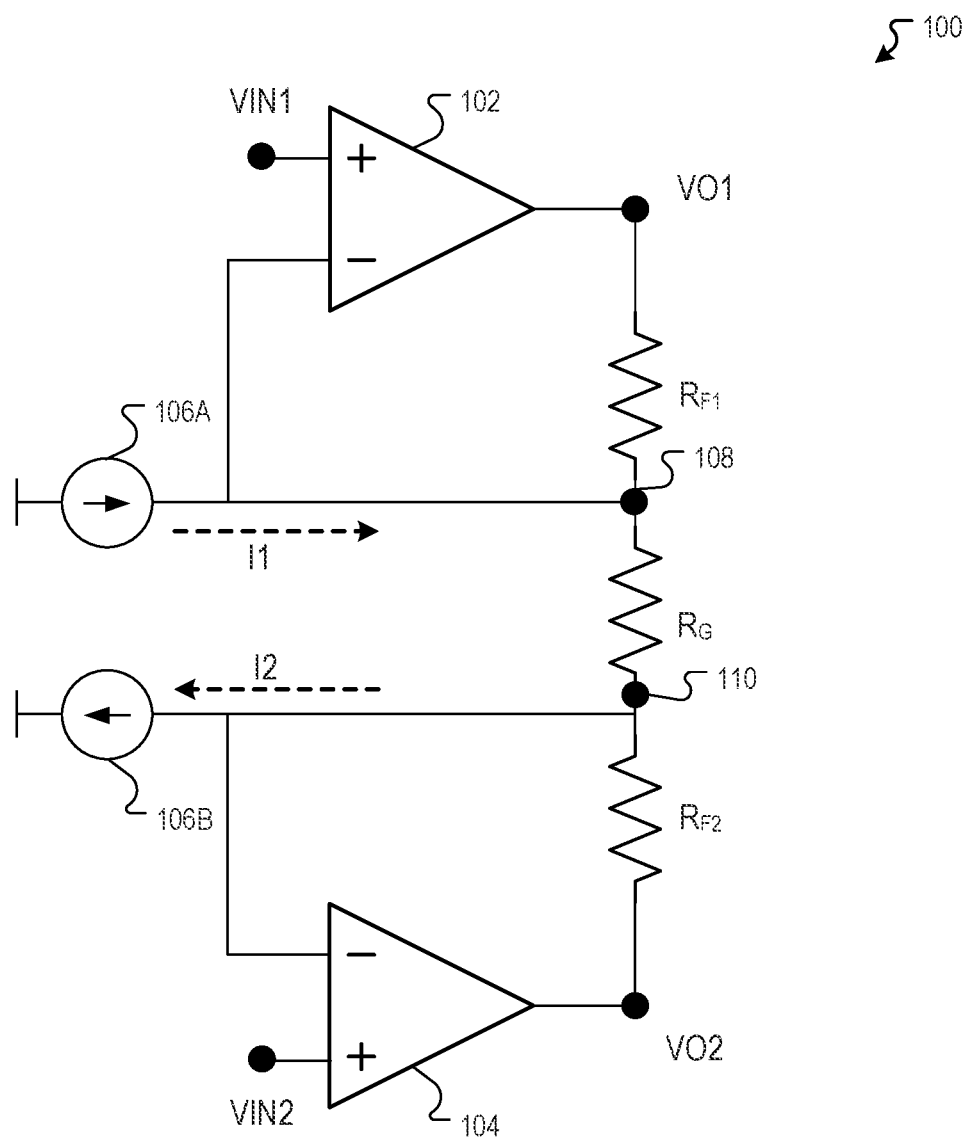
FIG. 1 is a diagram showing one example of an amplifier circuit with input offset compensation.

FIG. 1 is a diagram showing one example of an amplifier circuit 100 with input offset compensation. The amplifier circuit 100 includes a first amplifier 102 and a second amplifier 104. The respective amplifiers 102, 104 are differential amplifiers including respective inverting inputs (indicated by "−"), respective non-inverting inputs (indicated by "+") and respective outputs. An input signal is provided to the amplifier circuit 100 via the non-inverting input of the amplifier 102 (VIN1) and the non-inverting input of the amplifier 104 (VIN2). The input signal may be a difference between VIN1 and VIN2. The output of the amplifier circuit 100 is between the output of the amplifier 102 (VO1) and the output of the amplifier 104 (VO2).

In the example arrangement of FIG. 1, the amplifier 102 is arranged with a negative feedback path including a first feedback resistance $R_{F1}$ electrically coupled between the output of the amplifier 102 and the inverting input of the amplifier 102. The amplifier 104 is similarly arranged with a negative feedback path including a second feedback resistance $R_{F2}$ electrically coupled between the output of the amplifier 104 and the inverting input of the amplifier 104. In some examples, the first feedback resistance $R_{F1}$ and the second feedback resistance $R_{F2}$ have the same value. A gain resistance $R_G$ is electrically coupled between the first feedback resistance $R_{F1}$ and the second feedback resistance $R_{F2}$.

The amplifier circuit 100 also includes a first current source 106A and a second current source 106B. The first current source 106A provides a first current I1 to the gain resistance $R_G$. The second current source 106B provides a second current I2 to the gain resistance $R_G$. As indicated, the first current I1 and the second current I2 are provided in opposite directions. In this example, the first current I1 flows across the gain resistance $R_G$ from the first feedback resistance $R_{F1}$ and towards the second feedback resistance $R_{F2}$. Current sources 106A, 106B may be or include any suitable type of current source including, for example, a current digital-to-analog converter (DAC), or any other suitable circuit for generating a current.

The magnitude of the currents I1, I2 may be selected based on an input signal offset (e.g., an input signal offset voltage). In some examples, the magnitude of the currents I1 and I2 is selected to bring about an input offset gain of unity or one. That is, the input signal offset may be amplified by a factor of one while the signal-of-interest may be amplified by the closed loop gain of the amplifier circuit 100. For example, the feedback arrangement of the amplifier circuit 100 may cause the voltage VIN1 to appear at the node 108 between the feedback resistance $R_{F1}$ and the gain resistance $R_G$ and the voltage VIN2 to appear between the gain resistance $R_G$ and the feedback resistance $R_{F2}$. Accordingly, to generate an input signal offset gain of 1, the magnitude of the currents I1, I2 may be selected to set the output voltage VO1, VO2 equal to the inputs VIN1, VIN2 when the input signal offset is provided across the inputs VIN1, VIN2. This is given by Equation [1] below:

$$I1, I2 = \frac{Voffset}{R_G} \quad [1]$$

In Equation [1], Voffset is the input signal offset voltage and is given by Equation [2] below:

$$Voffset = VIN1 - VIN2 \quad [2]$$

Consider an example input signal having a DC input signal offset voltage of 50 mV with a signal-of-interest of 5 mV and a closed-loop gain of three (3). Setting the currents I1, I2 equal to 50 mV divided by the gain resistance $R_G$ may provide an output at VO1, VO2 that has an output offset signal voltage of 50 mV and a signal-of-interest of 15 mV.

In some examples, the magnitude of the currents I1, I2 is selected to bring about an input signal offset gain of null. That is, the input signal offset may be completely or substantially cancelled from the output signal at VO1, VO2. In some examples, the input signal offset gain of null can be brought about by selecting the magnitude of currents I1, I2 to drive both VO1 and VO2 to a common voltage when the input signal offset is present across the inputs VIN1, VIN2. In some examples, the common voltage is given by Equation [3] below:

$$VO1, VO2 = \frac{VIN1 + VIN2}{2} \quad [3]$$

The condition of Equation [3] may be achieved by setting the magnitude of the currents I1, I2 as indicated by Equation [4] below:

$$I1, I2 = \frac{Voffset}{R_G // R_F} = \frac{Voffset \times Gain}{R_G(Gain-1)} \quad [4]$$

In Equation [4], the symbol $R_G//R_F$ indicates $R_G$ in parallel with $R_F$, which can also be given by Equation [5]:

$$R_G // R_F = \frac{R_G \times R_F}{R_G + R_F} \quad [5]$$

In Equation [4], Gain is the gain of the amplifier circuit 100, given by Equation [6] below:

$$Gain(1st\ stage) = 1 + \frac{2R_F}{R_G} \quad [6]$$

In some examples, the amplifier circuit 100 is implemented with a feedback path between the input signal (VIN1-VIN2) and the current source or sources 106A, 106B generating the currents I1, I2. In this way, the current sources 106A, 106B may be configured to vary the currents I1, I2 to match the input signal offset voltage. For example, if the input signal has a variable offset voltage, the feedback path may prompt the current sources 106A, 106B to vary the currents I1, I2 such that the output of the amplifier circuit (VO1-VO2) matches the input signal offset voltage. For example, if the amplifier circuit 100 is configured to apply a unity gain to offset, the current sources 106A, 106B may vary the currents I1, I2 according to Equation [1]. If the amplifier circuit 100 is configured to apply a null gain to the offset, the current sources 106A, 106B may vary the currents I1, I2 according to Equation [4].

Also, in some examples, the magnitudes of the currents I1, I2 are based on a reference voltage. The reference voltage may be generated by any suitable circuitry. In some examples, the reference voltage is generated using a bandgap voltage reference circuit. In another example, the reference voltage is a power supply reference, for example, based on a power supply voltage for the amplifier circuit 100.

Figure 2:
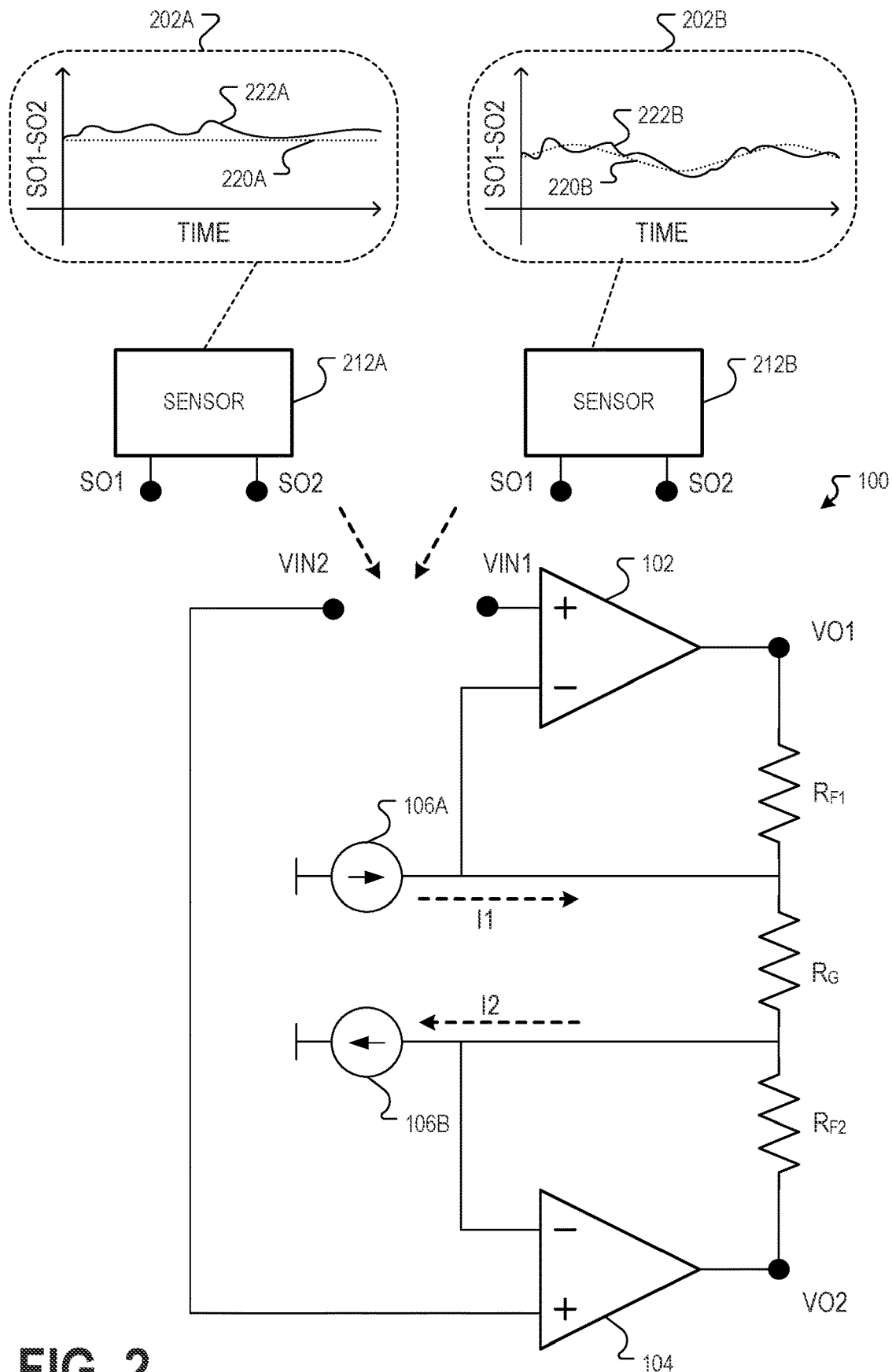
FIG. 2 is a diagram showing an example arrangement of the amplifier circuit showing example sensors that can provide an input signal having an input signal offset voltage.

FIG. 2 is a diagram showing an example arrangement of the amplifier circuit 100 showing example sensors 212A, 212B that can provide an input signal having an input signal offset voltage to the amplifier circuit 100. The sensors 212A, 212B provide sensor output signals at SO1, SO2. The sensor output signals generated by sensors 212A, 212B may be provided to the amplifier circuit 100. For example, SO1 may be electrically coupled to VIN1 and SO2 may be electrically coupled to VIN2. The amplifier circuit 100 may be alternatively coupled to one of the sensors 212A, 212B.

FIG. 2 includes a breakout window 202A showing an example sensor output signal 222A that may be provided SO1, SO2 of the sensor 212A. In the breakout window 202A, a horizontal axis indicates time and a vertical axis indicates the sensor output signal, illustrated as SO1-SO2. As shown the sensor output signal 222A of the example sensor 212A includes a DC voltage offset indicated by the line 220A. The sensor output signal 222A may provided to the amplifier circuit 100 as an input signal voltage, for example, at VIN1, VIN2. Examples of sensors that would generate a DC input signal offset voltage including, for example, strain gauge sensors, pressure sensors, resistive bridge sensors, etc.

FIG. 2 also includes a breakout window 202B showing an example sensor output signal 222B that may be provided SO1, SO2 of the sensor 212B. In the breakout window 202B, a horizontal axis indicates time and a vertical axis indicates the sensor output signal, illustrated as SO1-SO2. As shown the sensor output signal 222B of the example sensor 212B includes a varying voltage offset indicated by the curve 220B. The sensor output signal 222B may provided to the amplifier circuit 100 as an input signal voltage, for example, at VIN1, VIN2. Examples of sensors that would generate a varying input signal offset voltage include for example, sensors measuring biopotential metrics such as, for example, electrocardiogram (EKG) sensors, electromyography (EMG) sensors, electroencephalogram (EEG) sensors, electromagnetic flow meters, etc.

Figure 3:
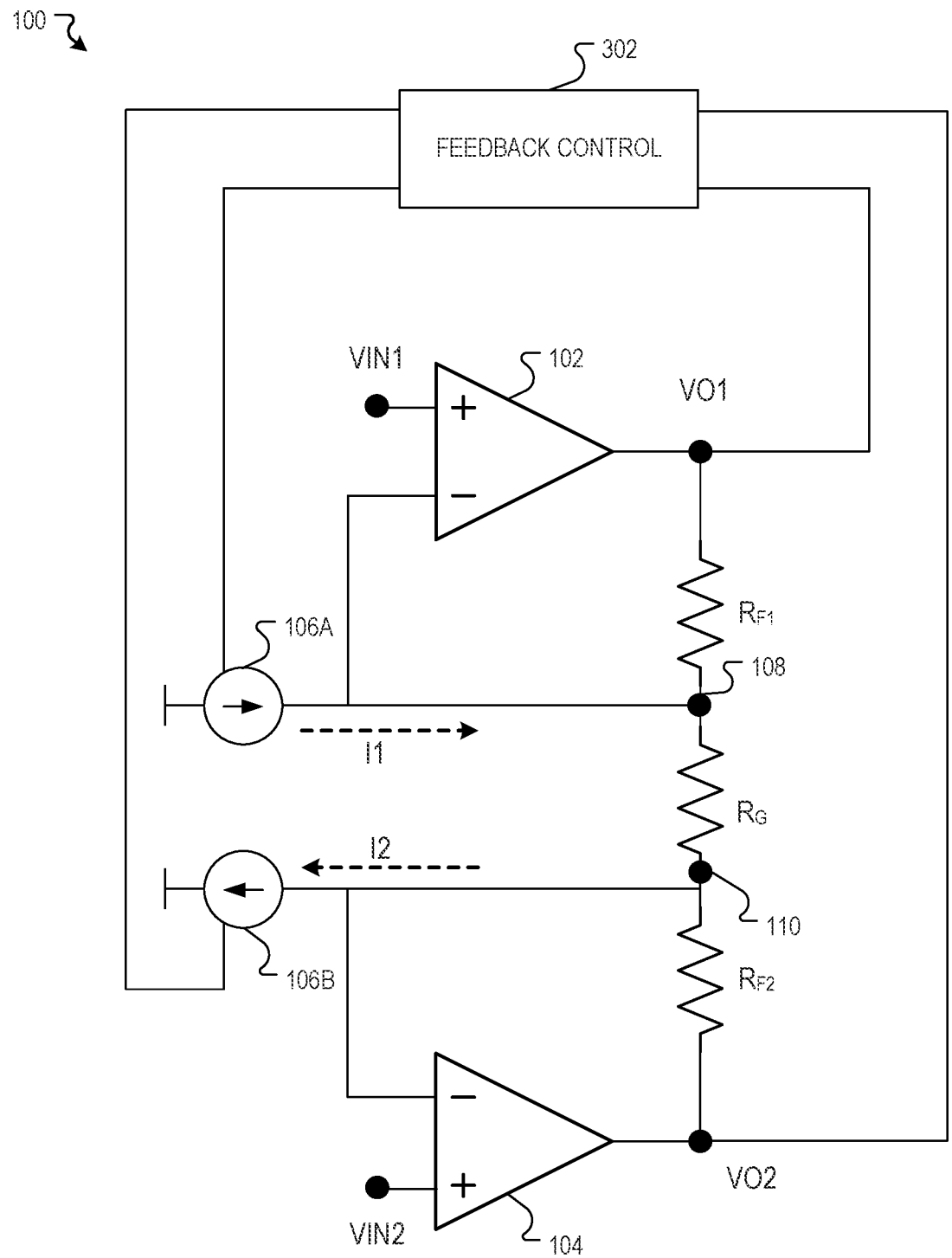
FIG. 3 is a diagram showing an arrangement of the amplifier circuit of FIG. 1 including a feedback control circuit.

FIG. 3 is a diagram showing an arrangement of the amplifier circuit 100 including a feedback control circuit 302. The feedback control circuit 302 receives an indication of the output of the amplifier circuit 100. In the example of FIG. 3, the feedback control circuit 302 receives an indication of the output of the amplifier 100 at outputs VO1, VO2. In other examples, the feedback control circuit 302 receives an indication of the output of the amplifier circuit 100 from other portions of the amplifier circuit 100, such as from the nodes 108, 110. This can be in addition to or instead of receiving feedback from the outputs VO1, VO2.

The feedback control circuit 302 provides a control signal or signals to the current sources 106A, 106B. The control signal instructs the current sources 106A, 106B to modify the currents I1, I2 to bring about a desired offset compensation for the amplifier circuit. In some examples, the feedback control circuit 302 is programmed to modify the currents I1, I2 to bring about an offset gain of one or unity. For example, the feedback control circuit 302 is configured to modify the currents I1, I2 such that the output voltage VO1, VO2 is equal to the inputs VIN1, VIN2 when the input signal offset is provided across the inputs VIN1, VIN2. In other examples, the feedback control circuit is configured to modify the currents I1, I2 to bring about an offset gain of null, for example, by driving VO1 and VO2 to a common voltage when the input signal offset is present across the inputs VIN1, VIN2.

Figure 4:
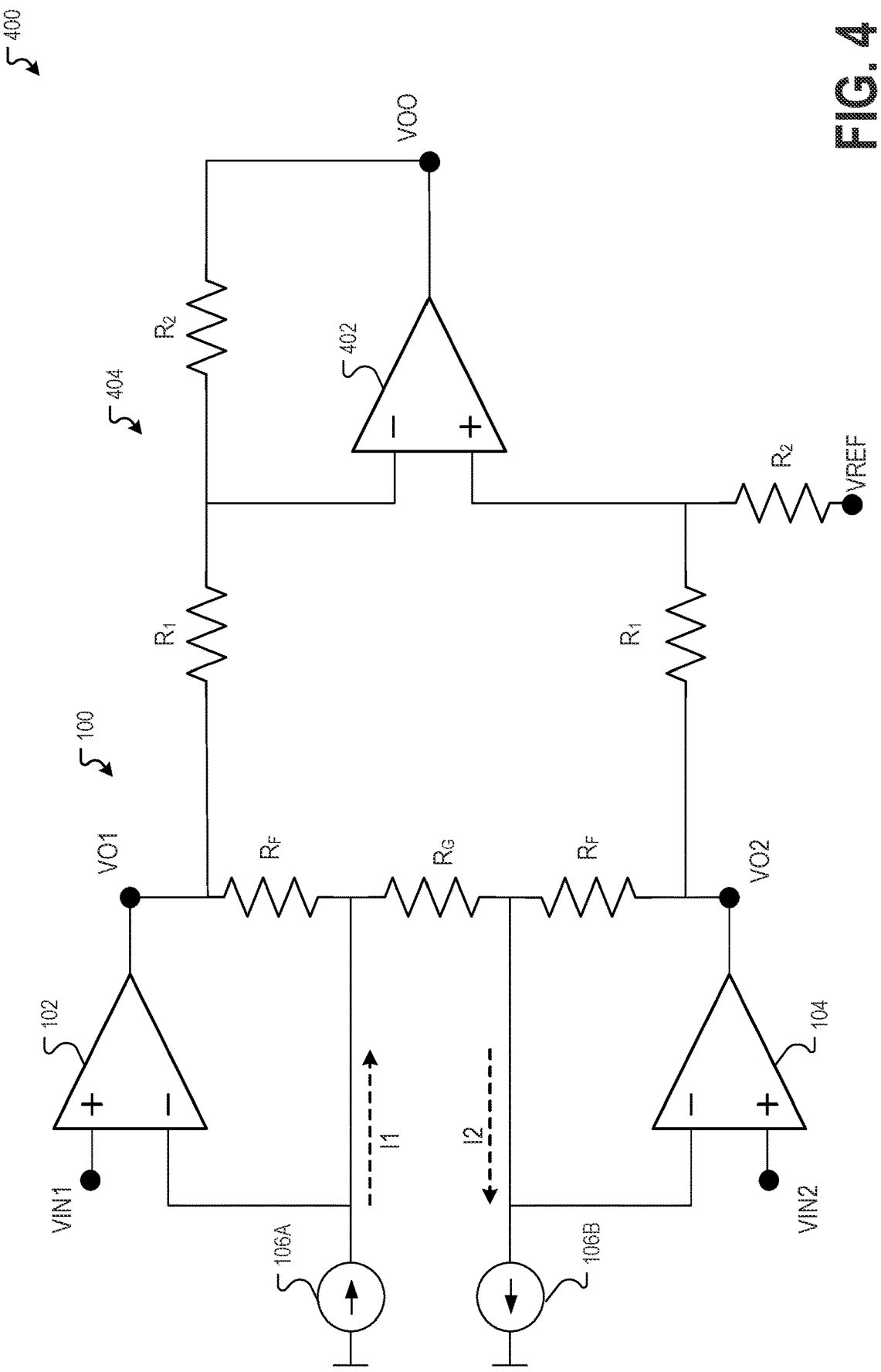
FIG. 4 is a diagram showing one example of an instrumentation amplifier circuit including the amplifier circuit as a first amplifier stage.

FIG. 4 is a diagram showing one example of an instrumentation amplifier circuit 400 including the amplifier circuit 100 as a first amplifier stage. In the example of FIG. 4, outputs VO1, VO2 of the amplifier circuit 100 are provided to a second stage 404 including a second stage amplifier 402, resistances R1 and resistances R2. A first example of the resistance R1 is electrically coupled between VO1 and an inverting input of the amplifier 402. A second example of the resistance R1 is electrically coupled between VO2 and a non-inverting input of the amplifier 402. A first example of R2 is electrically coupled between the non-inverting input of the amplifier 402 and a reference voltage VREF. A second example of the resistance R2 is electrically coupled between an output VOO of the amplifier 402 and the inverting input of the amplifier 402. The output of the second stage 404 is between the VOO and VREF.

The gain of the first stage is as given by Equation [6] above. The closed-loop gain of the output stage 404 may be determined by resistors R1, R2, for example, as given by Equation [7] below:

$$\text{Gain(2nd stage)} = \frac{R2}{R1} \quad [7]$$

Figure 5:
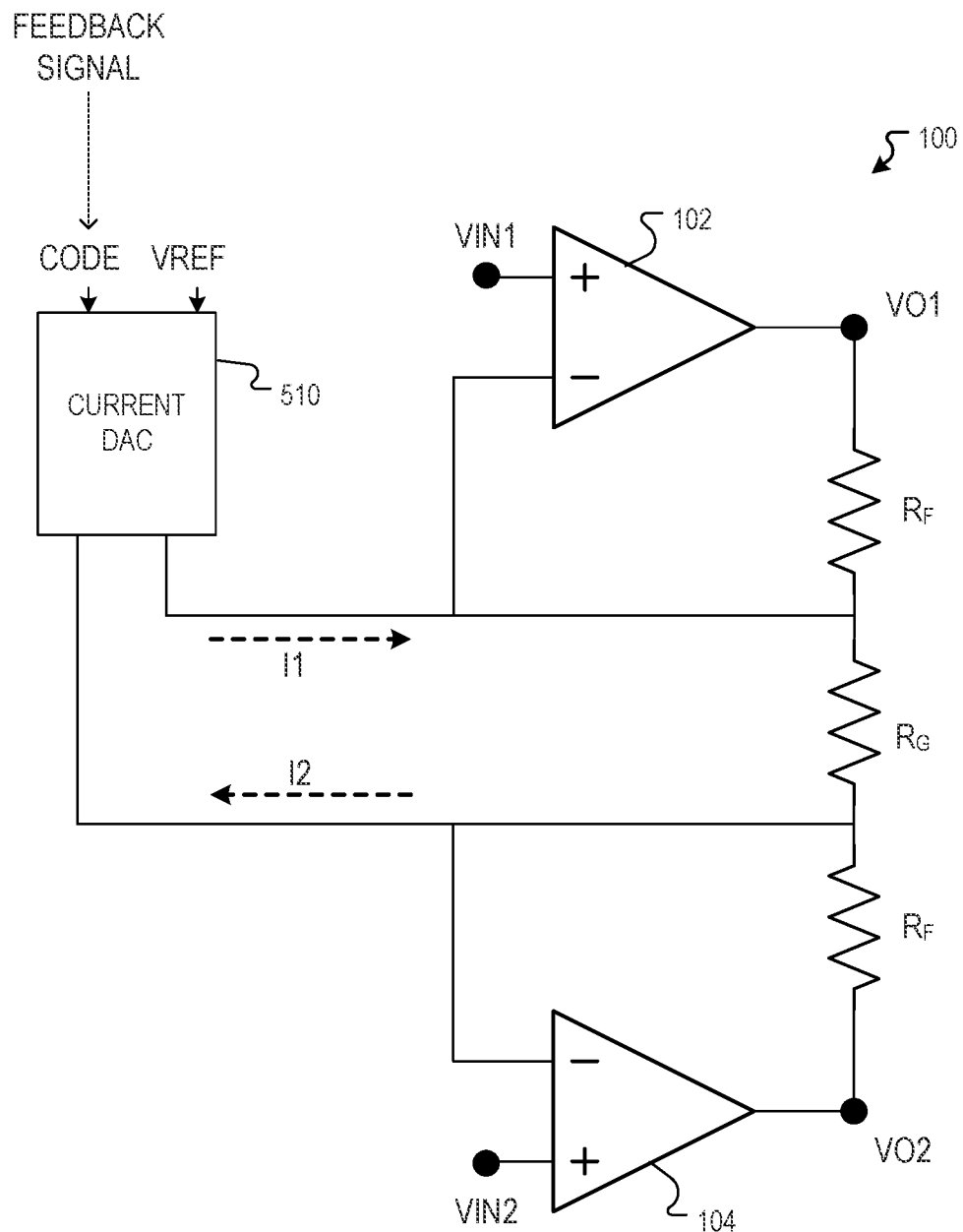
FIG. 5 is a diagram showing one example of the amplifier circuit in which the current sources for generating currents I1 and I2 are implemented using a current digital-to-analog converter (DAC).

In some examples, R1 may be equal to R2 such that the gain of the second stage 404 including the amplifier 402 is unity. In the example of FIG. 4, the current sources 106A, 106B may be configured to provide currents I1, I2 to set the offset gain, for example, to unity or null, as described herein. In examples where the offset gain of the amplifier circuit 100 is set to unity, the contribution of the offset to the output signal VOO may be equal to the offset multiplied by the gain given by Equation [7]. In examples where the offset gain of the amplifier circuit 100 is null, the offset may not contribute to VOO. FIG. 5 is a diagram showing one example of the amplifier circuit 100 in which the current sources for generating currents I1 and I2 are implemented using a current DAC 510. The current DAC 510 receives a digital code input (CODE) and a reference voltage (VREF). In response to the digital code input (CODE) and reference voltage (VREF), the current DAC 510 generates one or more currents I1, I2. The digital code and/or reference voltage may be, in some examples, based on a feedback signal indicating the input signal offset voltage. For example, the current DAC 510 is one example way for implementing the feedback circuit 302 of FIG. 3. In some examples, the reference voltage VREF is provided by a bandgap reference, a power supply voltage, etc.

Figure 6:
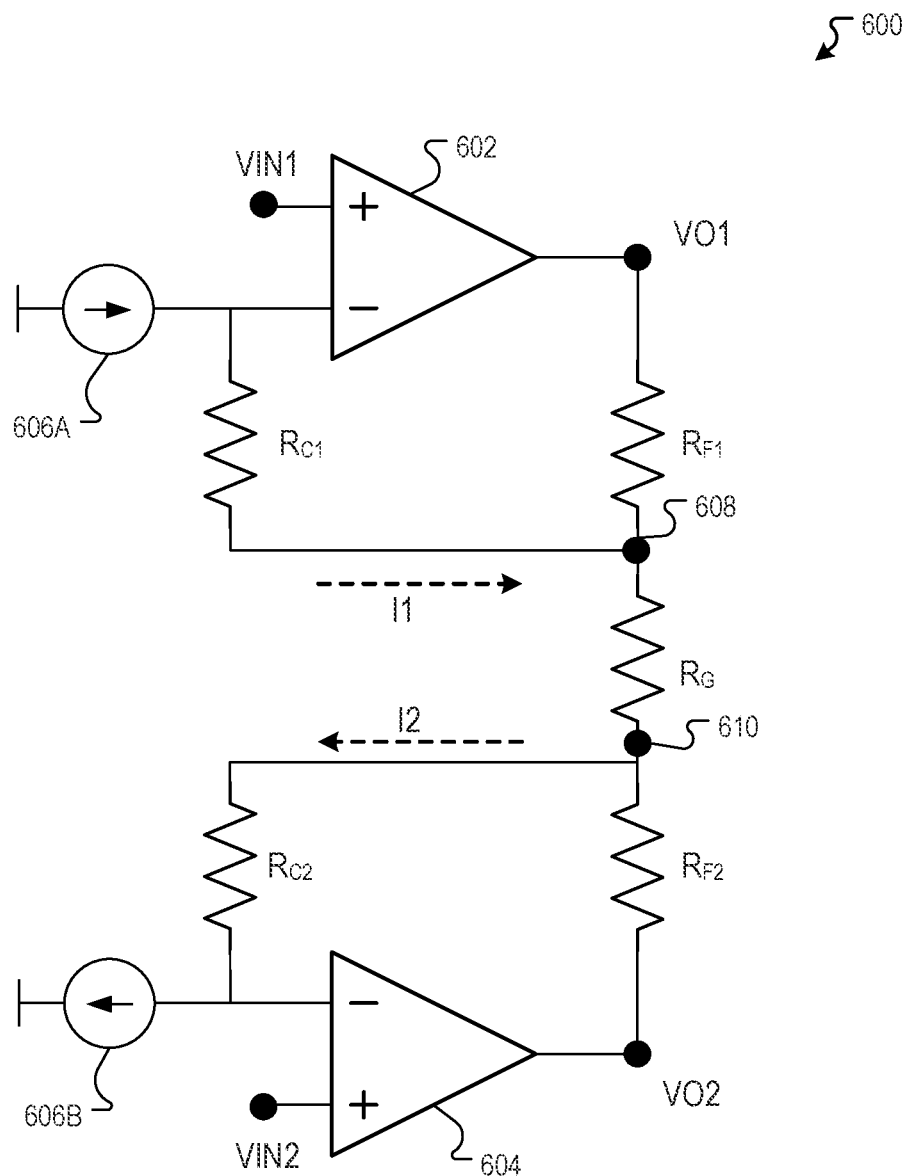
FIG. 6 is a diagram showing one example of an amplifier circuit with input offset compensation.

FIG. 6 is a diagram showing one example of an amplifier circuit 600 with input offset compensation. The amplifier circuit 600 amplifiers 602, and 604 having respective inverting inputs (indicated by "−"), respective non-inverting inputs (indicated by "+") and respective outputs. An input signal is provided to the amplifier circuit 600 via the non-inverting input of the amplifier 602 (VIN1) and the non-inverting input of the amplifier 604 (VIN2). The input signal may be a difference between VIN1 and VIN2. The output of the amplifier circuit 600 is between the output of the amplifier 602 (VO1) and the output of the amplifier 604 (VO2).

In the example arrangement of FIG. 6, the amplifier 602 is arranged with a negative feedback path including a first feedback resistance $R_{F1}$ electrically coupled between the output of the amplifier 602 and the inverting input of the amplifier 602. The amplifier 604 is similarly arranged with a negative feedback path including a second feedback resistance $R_{F2}$ electrically coupled between the output of the amplifier 604 and the inverting input of the amplifier 604. In some examples, the first feedback resistance $R_{F1}$ and the second feedback resistance $R_{F2}$ have the same value. A gain resistance $R_G$ is electrically coupled between the first feedback resistance $R_{F1}$ and the second feedback resistance $R_{F2}$.

The amplifier circuit 600 also includes a first current source 606A to provide a first current I1 to the gain resistance $R_G$ and a second current source 606B to provides a second current I2 to the gain resistance $R_G$. In the example amplifier circuit 600, the feedback paths of the amplifiers 602, 604 also include respective compensation resistances $R_{C1}$, $R_{C2}$. (Resistances $R_{C1}$ and $R_{C2}$ may have the same value and may be referred to generally as $R_C$.) In some examples, the amplifier circuit 600 is configured to generate a unity gain of the input signal offset voltage. In some examples, the amplifier circuit 600 (or a control circuit thereof) may sweep the currents I1, I2 with only the input signal offset voltage present at the inputs. The currents I1, I2 that result in a unity gain for the input offset voltage may be selected. In other examples, the amplifier circuit 600 is configured to generate a null gain of the input signal offset voltage by setting the magnitude of the currents I1, I2 according to Equation [8] below:

$$I1, I2 = \frac{Voffset}{2R_C + R_G // R_F} = \frac{Voffset \times \text{Gain}}{2R_C + R_G(\text{Gain} - 1)} \quad [8]$$

In the example amplifier circuit 600, if the value of $R_C$ is much larger than the gain resistance $R_G$, then dependence of the offset compensation on the gain of the circuit may be lessened. For example, as can be seen from Equation [8], if the value of $R_C$ is much larger than the gain resistance $R_G$, then the magnitude of the currents I1, I2 may be relatively constant for a given input signal offset without regard to the gain of the circuit.

Figure 7:
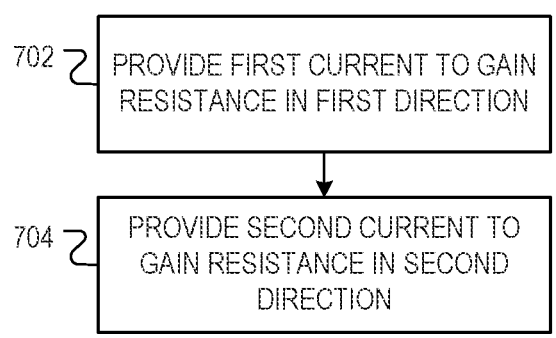
FIG. 7 is a flowchart showing one example of a process flow that may be executed using an amplifier circuit to execute offset compensation.

FIG. 7 is a flowchart showing one example of a process flow 700 that may be executed using an amplifier circuit, such as one of the amplifier circuits 100, 400, 600 described herein to execute offset compensation. At operation 702, a first current in a first direction is provided to the gain resistance $R_G$. The first current may be indicated by I1 and may be provided by a current source 106A, 606A, or current DAC 510. At operation 704, a second current in a second direction opposite to the first direction is provided to the gain resistance $R_G$. The second current may be indicated by I2 and may be provided by a current source 106B, 606B and/or by a current DAC 510. The first current I1 and the second current I2 may be selected to mitigate input offset, for example, by generating an offset gain of unity or null as described herein. In various examples, the first current I1 is provided at the same time as the current I2.

Figure 8:
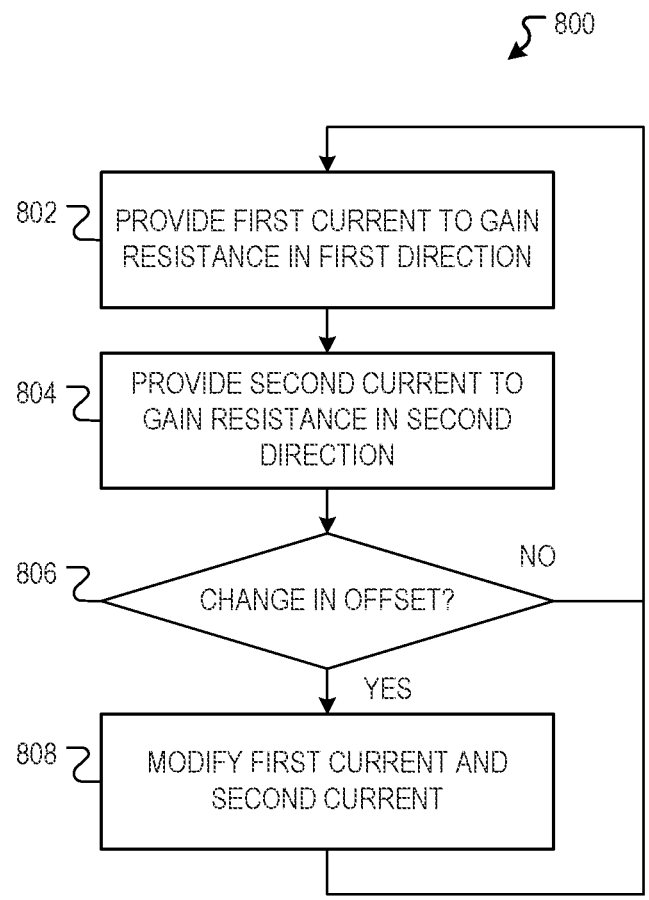
FIG. 8 is a flowchart showing one example of a process flow that may be executed using an amplifier circuit to execute offset compensation.

FIG. 8 is a flowchart showing one example of a process flow 800 that may be executed using an amplifier circuit, such as one of the amplifier circuits 100, 400, 600 described herein to execute offset compensation. The process flow 800, for example, may be executed utilizing the feedback control circuit 302 and/or the feedback signal provided to the current DAC 510. At operation 802, a first current in a first direction is provided to the gain resistance $R_G$. The first current may be indicated by I1 and may be provided by a current source 106A, 606A, or current DAC 510. At operation 804, a second current in a second direction opposite to the first direction is provided to the gain resistance $R_G$. The second current may be indicated by I2 and may be provided by a current source 106B, 606B and/or by a current DAC 510.

At operation 806, it is determined if there has been a change in the offset of the input signal. Operation 806 may be executed, for example, by a feedback control circuit 302, by a current DAC 510, or any other suitable component. A change in the offset of the input signal can be detected in any suitable manner. In some examples, a feedback signal is provided indicating the input signal (e.g., VIN1, VIN2, and/or a difference therebetween). In other examples, a feedback signal is provided indicating the output voltage (e.g., VO1, VO2, and/or a difference therebetween). In still other examples, in addition or instead, a feedback signal is provided indicating the state of nodes 108, 608 and 110, 610.

If there is a no change in the offset of the input signal, the first and second currents are maintained at operations 802 and 804. If there is a change in the offset of the input signal at operation 806, then the first current and/or second current are modified at operation 808. For example, the first and second currents may be modified to maintain a desired gain of the offset to the input signal (e.g., unity or null). Modified first and second currents may be provided at operations 802 and 804.

Figure 9:
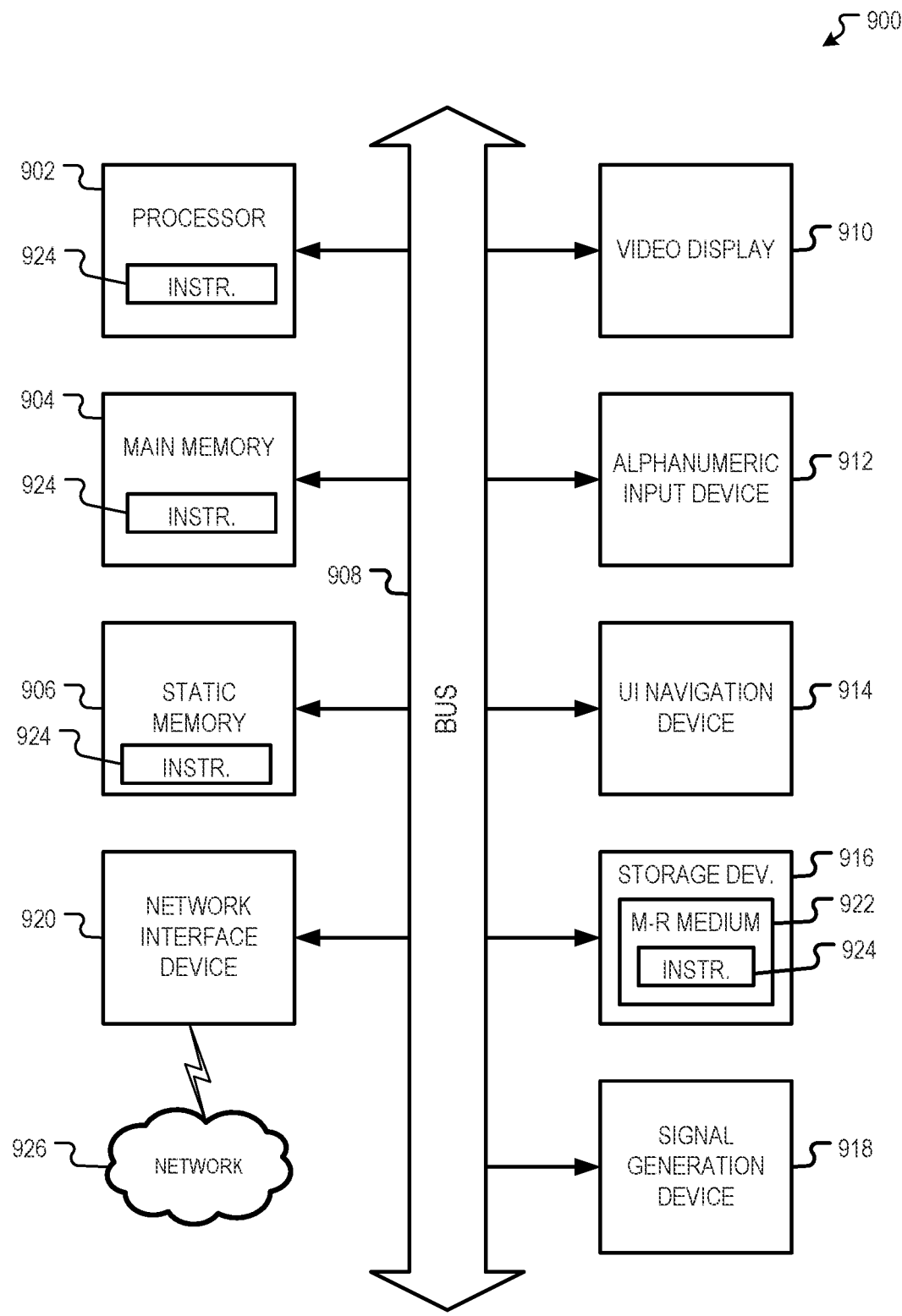
FIG. 9 is a block diagram illustrating a computing device hardware architecture, within which a set or sequence of instructions can be executed to cause a machine to perform examples of any one of the methodologies discussed herein.

FIG. 9 is a block diagram illustrating a computing device hardware architecture 900, within which a set or sequence of instructions can be executed to cause a machine to perform examples of any one of the methodologies discussed herein. For example, the architecture 900 may describe one or more processors or other computing devices that may be used to implement a control circuit to execute the process flow 700 and 800 described herein. In other examples, an architecture, such as the architecture 900, may receive the output of one or more amplifier circuits, such as the amplifier circuits 100, 400, 600 described herein, and perform various processing based on the received signals.

The architecture 900 may operate as a standalone device or may be connected (e.g., networked) to other machines. In a networked deployment, the architecture 900 may operate in the capacity of either a server or a client machine in server-client network environments, or it may act as a peer machine in peer-to-peer (or distributed) network environments. The architecture 900 can be implemented in an embedded system, a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 900 includes a processor unit 902 comprising at least one processor (e.g., a central processing unit (CPU), a graphics processing unit (GPU), or both, processor cores, compute nodes). The architecture 900 may further comprise a main memory 904 and a static memory 906, which communicate with each other via a link 908 (e.g., a bus). The architecture 900 can further include a video display unit 910, an input device 912 (e.g., a keyboard), and a UI navigation device 914 (e.g., a mouse). In some examples, the video display unit 910, input device 912, and UI navigation device 914 are incorporated into a touchscreen display. The architecture 900 may additionally include a storage device 916 (e.g., a drive unit), a signal generation device 918 (e.g., a speaker), a network interface device 920, and one or more sensors (not shown), such as a Global Positioning System (GPS) sensor, compass, accelerometer, or other sensor.

In some examples, the processor unit 902 or another suitable hardware component may support a hardware interrupt. In response to a hardware interrupt, the processor unit 902 may pause its processing and execute an ISR, for example, as described herein.

The storage device 916 includes a machine-readable medium 922 on which is stored one or more sets of data structures and instructions 924 (e.g., software) embodying or used by any one or more of the methodologies or functions described herein. The instructions 924 can also reside, completely or at least partially, within the main memory 904, within the static memory 906, and/or within the processor unit 902 during execution thereof by the architecture 900, with the main memory 904, the static memory 906, and the processor unit 902 also constituting machine-readable media.

Executable Instructions and Machine-Storage Medium

The various memories (i.e., 904, 906, and/or memory of the processor unit(s) 902) and/or the storage device 916 may store one or more sets of instructions and data structures (e.g., the instructions 924) embodying or used by any one or more of the methodologies or functions described herein. These instructions, when executed by the processor unit(s) 902, cause various operations to implement the disclosed examples.

As used herein, the terms "machine-storage medium," "device-storage medium," and "computer-storage medium" (referred to collectively as "machine-storage medium") mean the same thing and may be used interchangeably. The terms refer to a single or multiple storage devices and/or media (e.g., a centralized or distributed database, and/or associated caches and servers) that store executable instructions and/or data, as well as cloud-based storage systems or storage networks that include multiple storage apparatus or devices. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Signal Medium

The term "signal medium" or "transmission medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium" and "device-readable medium" mean the same thing and may be used interchangeably in this disclosure. The terms are defined to include both machine-storage media and signal media. Thus, the terms include both storage devices/media and carrier waves/modulated data signals.

The instructions 924 can further be transmitted or received over a communications network 926 using a transmission medium via the network interface device 920 using any one of a number of well-known transfer protocols (e.g., Hypertext Transfer Protocol (HTTP)). Examples of communication networks include a local area network (LAN), a wide area network (WAN), the Internet, mobile telephone networks, plain old telephone service (POTS) networks, and wireless data networks (e.g., Wi-Fi, 3G, 4G Long-Term Evolution (LTE)/LTE-A, 5G, or WiMAX networks).

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 902.16 family of standards known as WiMax®), IEEE 902.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is an amplifier circuit for compensating an input signal voltage offset, the amplifier circuit comprising: a first amplifier stage, comprising: a first amplifier comprising a first inverting input, a first non-inverting input, and a first output; a first feedback resistance electrically coupled between the first inverting input and the first output; a second amplifier comprising a second inverting input, a second non-inverting input, and a second output; a second feedback resistance electrically coupled between the second inverting input of the second amplifier and a second output of the second amplifier; a gain resistance electrically coupled between the first feedback resistance and the second feedback resistance; a first current source electrically coupled to provide a first current across the gain resistance; and a second current source electrically coupled to provide a second current across the gain resistance, the second current having a direction opposite the first current.

In Example 2, the subject matter of Example 1 optionally includes the first current having a magnitude to equal to the input signal voltage offset divided by the gain resistance.

In Example 3, the subject matter of any one or more of Examples 1-2 optionally includes the first current having a magnitude equal to the input signal voltage offset divided by a quantity based on the gain resistance, the first feedback resistance, and the second feedback resistance.

In Example 4, the subject matter of any one or more of Examples 1-3 optionally includes a current digital-to-analog converter having a voltage reference input and a digital code input, the current digital-to-analog converter electrically coupled to provide the first current across the gain resistance responsive to the voltage reference input and the digital code input.

In Example 5, the subject matter of Example 4 optionally includes a bandgap voltage reference circuit electrically coupled to provide a voltage reference signal to the voltage reference input.

In Example 6, the subject matter of any one or more of Examples 1-5 optionally includes the input signal voltage offset being variable, wherein the first current source is a variable current source configured to vary the first current based at least in part on the input signal voltage.

In Example 7, the subject matter of any one or more of Examples 1-6 optionally includes a compensation resistance electrically coupled between the first current source and the gain resistance.

In Example 8, the subject matter of any one or more of Examples 1-7 optionally includes a second amplifier stage electrically coupled to the first output and the second output, the second amplifier stage comprising a second amplifier stage output.

Example 9 is a method for operating an amplifier circuit to mitigate an input signal voltage offset comprising a first amplifier, a second amplifier, a first feedback resistance electrically coupled between an inverting input of the first amplifier and an output of the first amplifier, a second feedback resistance electrically coupled between an inverting input of the second amplifier and an output of the second amplifier and a gain resistance electrically coupled between the first feedback resistance and the second feedback resistance, the method comprising: providing a first current across the gain resistance in a first direction; and providing a second current across the gain resistance in a second direction opposite the first direction.

In Example 10, the subject matter of Example 9 optionally includes the first current having a magnitude to equal to the input signal voltage offset divided by the gain resistance.

In Example 11, the subject matter of any one or more of Examples 9-10 optionally includes the first current having a magnitude equal to the input signal voltage offset divided by a quantity based on the gain resistance, the first feedback resistance, and the second feedback resistance.

In Example 12, the subject matter of any one or more of Examples 9-11 optionally includes providing a digital code to a current digital-to-analog converter; and responsive to the digital code, providing the first current by the current digital-to-analog converter.

In Example 13, the subject matter of Example 12 optionally includes providing a reference voltage to the current digital-to-analog converter.

In Example 14, the subject matter of Example 13 optionally includes generating the reference voltage with a bandgap voltage reference circuit.

In Example 15, the subject matter of any one or more of Examples 9-14 optionally includes the input signal voltage offset being variable, further comprising varying the first current based at least in part on the input signal voltage offset.

Example 16 is an input signal voltage offset compensating amplifier circuit comprising: a first amplifier; a second amplifier; a first feedback resistance electrically coupled between an inverting input of the first amplifier and an output of the first amplifier; a second feedback resistance electrically coupled between an inverting input of the second amplifier and an output of the second amplifier and a gain resistance electrically coupled between the first feedback resistance and the second feedback resistance; means for providing a first current across the gain resistance in a first direction; and means for providing a second current across the gain resistance in a second direction opposite the first direction.

In Example 17, the subject matter of Example 16 optionally includes the first current having a magnitude to equal to the input signal voltage offset divided by the gain resistance.

In Example 18, the subject matter of any one or more of Examples 16-17 optionally includes the first current having a magnitude equal to the input signal voltage offset divided by a quantity based on the gain resistance, the first feedback resistance, and the second feedback resistance.

In Example 19, the subject matter of any one or more of Examples 16-18 optionally includes the means for providing the first current across the gain resistance comprising a bandgap voltage reference circuit.

In Example 20, the subject matter of any one or more of Examples 16-19 optionally includes the input signal voltage offset being variable, further comprising means for varying the first current based at least in part on the input signal voltage offset.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An amplifier circuit for compensating an input signal voltage offset, the amplifier circuit comprising:
    a first amplifier stage, comprising:
    a first amplifier comprising a first inverting input, a first non-inverting input, and a first output;
    a first feedback resistance electrically coupled between the first inverting input and the first output;
    a second amplifier comprising a second inverting input, a second non-inverting input, and a second output;

a second feedback resistance electrically coupled between the second inverting input of the second amplifier and a second output of the second amplifier;

a gain resistance electrically coupled between the first feedback resistance and the second feedback resistance;

a first current source electrically coupled to provide a first current across the gain resistance; and a second current source electrically coupled to provide a second current across the gain resistance, the second current having a direction opposite the first current.

2. The amplifier circuit of claim 1, the first current having a magnitude to equal to the input signal voltage offset divided by the gain resistance.

3. The amplifier circuit of claim 1, the first current having a magnitude equal to the input signal voltage offset divided by a quantity based on the gain resistance, the first feedback resistance, and the second feedback resistance.

4. The amplifier circuit of claim 1, further comprising a current digital-to-analog converter having a voltage reference input and a digital code input, the current digital-to-analog converter electrically coupled to provide the first current across the gain resistance responsive to the voltage reference input and the digital code input.

5. The amplifier circuit of claim 4, further comprising a bandgap voltage reference circuit electrically coupled to provide a voltage reference signal to the voltage reference input.

6. The amplifier circuit of claim 1, the input signal voltage offset being variable, wherein the first current source is a variable current source configured to vary the first current based at least in part on the input signal voltage.

7. The amplifier circuit of claim 1, further comprising a compensation resistance electrically coupled between the first current source and the gain resistance.

8. The amplifier circuit of claim 1, further comprising a second amplifier stage electrically coupled to the first output and the second output, the second amplifier stage comprising a second amplifier stage output.

9. A method for operating an amplifier circuit to mitigate an input signal voltage offset comprising a first amplifier, a second amplifier, a first feedback resistance electrically coupled between an inverting input of the first amplifier and an output of the first amplifier, a second feedback resistance electrically coupled between an inverting input of the second amplifier and an output of the second amplifier and a gain resistance electrically coupled between the first feedback resistance and the second feedback resistance, the method comprising:

providing a first current across the gain resistance in a first direction; and providing a second current across the gain resistance in a second direction opposite the first direction.

10. The method of claim 9, the first current having a magnitude to equal to the input signal voltage offset divided by the gain resistance.

11. The method of claim 9, the first current having a magnitude equal to the input signal voltage offset divided by a quantity based on the gain resistance, the first feedback resistance, and the second feedback resistance.

12. The method of claim 9, further comprising:

providing a digital code to a current digital-to-analog converter; and responsive to the digital code, providing the first current by the current digital-to-analog converter.

13. The method of claim 12, further comprising providing a reference voltage to the current digital-to-analog converter.

14. The method of claim 13, further comprising generating the reference voltage with a bandgap voltage reference circuit.

15. The method of claim 9, the input signal voltage offset being variable, further comprising varying the first current based at least in part on the input signal voltage offset.

16. An input signal voltage offset compensating amplifier circuit comprising:

a first amplifier;

a second amplifier;

a first feedback resistance electrically coupled between an inverting input of the first amplifier and an output of the first amplifier;

a second feedback resistance electrically coupled between an inverting input of the second amplifier and an output of the second amplifier and a gain resistance electrically coupled between the first feedback resistance and the second feedback resistance;

means for providing a first current across the gain resistance in a first direction; and means for providing a second current across the gain resistance in a second direction opposite the first direction.

17. The amplifier circuit of claim 16, the first current having a magnitude to equal to the input signal voltage offset divided by the gain resistance.

18. The amplifier circuit of claim 16, the first current having a magnitude equal to the input signal voltage offset divided by a quantity based on the gain resistance, the first feedback resistance, and the second feedback resistance.

19. The amplifier circuit of claim 16, the means for providing the first current across the gain resistance comprising a bandgap voltage reference circuit.

20. The amplifier circuit of claim 16, the input signal voltage offset being variable, further comprising means for varying the first current based at least in part on the input signal voltage offset.

* * * * *